United States Patent [19]

Farassat

[11] Patent Number: 4,928,871
[45] Date of Patent: May 29, 1990

[54] APPARATUS AND METHOD OF CONTROLLED FEED OF A BONDING WIRE TO THE "WEDGE" OF A BONDING HEAD

[75] Inventor: Farhad Farassat, Munich, Fed. Rep. of Germany

[73] Assignee: Emhart Deutschland GmbH, Oberhaching, Fed. Rep. of Germany

[21] Appl. No.: 314,191

[22] Filed: Feb. 22, 1989

[30] Foreign Application Priority Data

Feb. 23, 1988 [DE] Fed. Rep. of Germany ....... 3805584
Jul. 26, 1988 [DE] Fed. Rep. of Germany ....... 3825373

[51] Int. Cl.[5] .......................................... H05K 13/06
[52] U.S. Cl. ..................................... 228/179; 228/4.5
[58] Field of Search ............. 228/4.5, 6.1, 179, 180.2, 228/54, 51, 55, 218, 219, 264

[56] References Cited

U.S. PATENT DOCUMENTS 3,357,090 12/1967 Tiffany ................................. 228/54

FOREIGN PATENT DOCUMENTS 5573789 1/1982 Japan .
58-218131 12/1983 Japan .
159743 7/1986 Japan ................................... 228/4.5
592365 10/1977 Switzerland .

OTHER PUBLICATIONS

IBM Technical Disclosure Bulletin, vol. 31, No. 3, Aug. 1988, p. 206, Novel Laser Soldering Process.

Primary Examiner—M. Jordan
Attorney, Agent, or Firm—Lorusso & Loud

[57] ABSTRACT

An apparatus for and a method of controlled feed of a bonding wire, specifically a golden bonding wire, to the wedge or the capillary tube of a bonding head arranged for upward and downward movement. The apparatus is characterized by a bonding-wire guide duct ahead of the bonding capillary tube, with a fluid pipe opening into this duct which is suited for optional communication with a source of gas blast, specifically air blast, or a vacuum source, and is preferably also characterized by a bonding-wire slip clamp which is effective or closed either permanently or only when the bonding head is lowered for touch-down, and which is disposed particularly ahead of or at the capillary-facing end of the guide duct. Moreover, a stationary bonding-wire clamp may join the bonding-wire guide duct which, depending on the level of the bonding head, may be closed or opened while retracting and correspondingly severing a bonding wire section that may project downwardly from the capillary tube tip, immediately before the second touch-down.

14 Claims, 2 Drawing Sheets

APPARATUS AND METHOD OF CONTROLLED FEED OF A BONDING WIRE TO THE "WEDGE" OF A BONDING HEAD

The present invention relates to an apparatus for as well as a method of controlled feed of a bonding wire, specifically a golden bonding wire, to the "wedge" or the capillary tube of a bonding head.

The term "bonding" in micro-electronics denotes generally the mutual bonding of electronic devices by adhesive of welding methods, as contrasted against the common soldering techniques where a soldering auxiliary (mostly a tin/lead alloy) is used to establish the desired bond. In this sphere a distinction is made between the chip (die) bonding methods by which a device is fastened on a supporting substrate, and wire bonding methods where the device terminals are connected to the supporting carrier substrate by means of fine wires. The present invention relates to a detail of the latter method. Here, the so-called thermo-compression bonding method, also known by the term of nail-head ball bonding, is distinguished from the so-called ultrasonic-wedge bonding method. The so-called thermosonic bonding is a combination of the thermo compression and the ultrasonic-wedge bonding methods. This method is gaining more and more acceptance. Here gold wire is mostly applied which, in a way similar to the ball bonding method, is fused to form a ball. The welding process is carried out at moderate heat produced by means of ultrasonic means. This method is comparatively easy to manage and is also suited for automation. As far as the aforedescribed prior art is concerned reference is made to the U.S. Pat. No. 34 59 355, 57 090, and 31 28 649, as well as to the German Patent Nos. DE-A 33 35 840 and DE-C 35 37 551, all of which furnish a certain general survey of the aforementioned bonding techniques.

In all wire bonding methods, the bonding wire is either drawn by clamps or tongues to the bonding pad or is removed from the pad after bonding so that the bonding wire may be torn off. During the formation of a loop the aforementioned clamps and tongues are open so that the bonding wire may be tightened up without excessive resistance. This fact, however, results in the aspect that tthe length of the drawn wire and thus the loop size depend on someaccidental resistance offered at the wire coil and in the wire guiding system. With major loops it has become evident that the length of wire required to form a loop is very often too small. With smaller loops the opposite condition prevails frequently.

In ball bonding the additional so-called "golf stroke" problem arises. The "ball" which is formed at a spacing in the range of some μ from the capillary opening is pushed towards the "pad" or the bonding location with the result that the ball hits the bonding location, possibly even bounces back, before the capillary tube will be completely lowered to fuse the ball to the bonding location, while the bonding wire is drawn from the coil practically without any resistance being offered. In this constellation the ball frequently loses its alignment with the capillary tube or the approximately conically flaring capillary opening facing the bonding location, with the result that an imperfect bonding will be achieved. It is thus decisive in the ball-bonding technique that the wire tension be kept constant not only during the loop formation but also during "ball touchdown" so as to achieve a precise bonding.

The present invention is therefore based on the problem of controlling the feed of the bonding wire in a way that a defined loop size will be maintained all through the operation cycle of the bonder while in ball bonding the so-called "golf stroke" effect will also be avoided, while the mechanical effects acting upon the bonding wire should be kept at a minimum.

The present invention provides a solution of this problem by the feature that a coaxial gas, specifically air, blast is used to push the bonding wire during the bonding process, specifically during the loop formation step, towards the "wedge" or the capillary tube of the bonding head, or to exert a traction on said bonding wire in the direction away from the "wedge" or the capillary tube of the bonding head, while maintaining an approximately constant wire tension, to which end the "wedge" or the bonding capillary tube is preceded by a bonding-wire guide duct in which a fluid pipe opens which may optionally communicate with a gas blast, specifically air-blast, source or a vacuum source. Due to the fluid effect on the bonding wire, the wire may be advanced or retained or braked as required, whenever desired without any mechanical action, while a substantially constant wire tension is maintained so that a defined length of wire may be observed for the formation of a loop while, in ball bonding, the so-called "golf stroke" effect may be avoided as well. With minor loops and at "ball touch-down" the bonding wire is normally braked under fluid control; with major loops the bonding wire is preferably advanced under fluid control. Even the regular retightening and further supply of the bonding wire before a repeated bonding cycle may take place merely under fluid control with application of the aforementioned system. In such a case a mechanical effect onto the bonding wire still be required only to tear the wire off. This is a particular advantage with thin and sensitive gold wire. It should be mentioned here that it is known per se from the Swiss Patent No. CH-A 592 365 to employ an external gas flow to control the bonding-wire tension. According to the publication, however, the gas flow does not act immediately upon the bonding wire in the sense of a fluid-controlled wire feed or fluid-controlled "braking" but rather becomes effective only indirectly through a tube loop which may be rotated under fluid control and through which the bonding-wire is guided to the bonding pad. The desigh according to the Swiss Patent No. CH-A 592 365 does not at all provide for any effect on the bonding-wire tension by connection of a vacuum source.

An additional improvement in terms of precision and speed of operation may be achieved by a bonding-wire slip clamp which is associated with the bonding-wire guide duct and is disposed ahead of the same or at the latter's capillary end, which clamp is effective or closed either permanently or only when the bonding head is lowered for "touch-down".

The bonding-wire slip clamp is preferably a clamp whose operative clamping surfaces are coated with felt or similar material. It is thus possible to draw the bonding wire through the clamp while a defined tension will be maintained. The bonding-wire slip clamp according to the present invention not only maintains a defined bonding-wire tension and thus bonding-wire rigidity but entails also the great advantage that a certain spin which is inherent in the bonding-wire will be removed or extracted from the wire, with the result that uncontrolled warping of the bonding wire in loop formation will be precluded. The slip clamp according to the present invention thus provides for the formation of precise loops. The slip clamp is preferably controllable which means that it may be opened and closed as a function of the vertical movements of the bonding head and of the corresponding effects exerted on the bonding wire.

The disposition of the slip clamp at the capillary end of the bonding-wire guide duct, which is proposed according to the present invention, is particularly effective on account of its proximity to the bonding head. The creation of a pressurized condition or a vacuum in the guide duct is no longer influenced by the arrangement of the slip clamp at the capillary end of the guide duct.

Preferably in combination with the aforedescribed slip clamp, but even independently thereof, a stationary bonding-wire clamp is disposed down-stream of the bonding-wire guide duct; this clamp may be closed or opened as a function of the momentary level of the bonding head or the spacing between the capillary tip and the bonding pad, with retraction and corresponding removal of a bonding-wire section projecting from the capillary tip downwardly, immediately prior to "touch-down".

In this manner, the optimum wire length for loop formation may be defined or programmed in anticipation. Excessive wire lengths will be removed in the area of the capillary tube tip as far as this cannot be achieved by fluid-controlled braking of the bonding wire or by retention of the bonding wire by means of the aforedescribed slip clamp. This effect contributes to the elimination of imperfect contacts after formation of each loop. Above all, it is possible to achieve that even with the second bonding cycle after loop formation, the bonding wire will not rest on the bonding pad and project beyone the proper "contact" location.

With simultaneous use of the aforedescribed slip clamp, thus rigid loops of an optium length may be produced while imperfect contacts will be avoided.

With application of the aforedescribed structural measures, the bonding process takes preferably place in the way defined in claims 10 to 12 or 13 and/or 14.

In the following, some embodiments of the system of the present invention will be described in more detail, with reference to the attached drawing, wherein.

Figure 1:
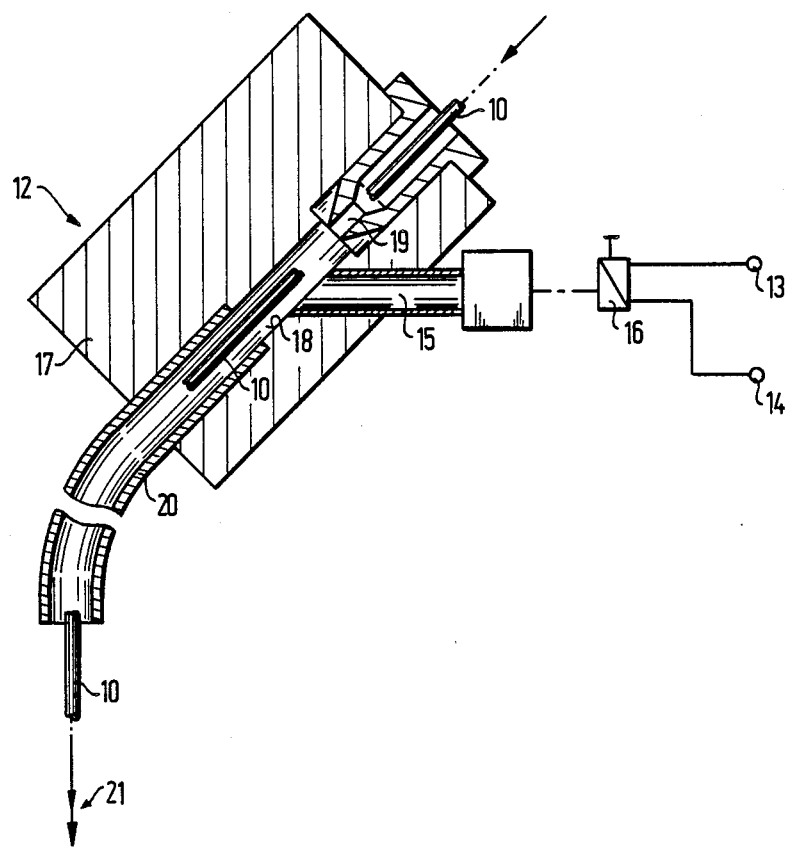
FIG. 1 is a schematic, partly sectional, side view of a plain embodiment of an inventive apparatus.

According to FIG. 1, a bonding-wire guide 12 is provided for controlled feed of a bonding wire 10 to a "wedge" or capillary tube (both elements not represented in FIG. 1) of a bonding head, which guide is disposed ahead of the wedge or the bonding capillary tube and into which opens a fluid pipe 15 for optional communication with a gas blast source, i.e. a compressed-air source 13, or a vacuum source 14. The latter fluid pipe 15 is associated with a change-over valve 16 which serves to connect the fluid pipe 15 either with the compressed-air supply 13 or the vacuum source 14. The change-over valve 16 is linked up with the process controller of the bonder or the bonding head thereof, which is not represented in detail here.

The bonding-wire guide system 12 includes a fitting block 17 with a passage 18; at the end of the passage, which faces the wire coil, a wire-guiding orifice 19 is fixed while at the wedge - or capillary end of the passage 18 a wire conduit guide 20 is inserted. The fluid pipe 15 which may communicate with the compressed-air supply or the vacuum source, is located directly behind the orifice 19. It opens into the passage 18 at a location between the wire-guiding orifice 19 and the conduit guide 20. The wire-guiding orifice 19 has a sesign similar to a bonding capillary tube. At its wedge- or capillary-facing end it is restricted in the shape of a nozzle through which the bonding wire 10, coming from the non-illustrated wire coil, will be threaded. Threading, and whenever required feed, of the bonding wire 10 to the wedge or the capillary tube is assisted by compressed air since with an appropriate setting of the change-over valve 16 an air-blast is introduced through the pipe 15 into the passage 18. The pipe 15 opens into the passage 18 at an acute angle from the longitudinal axis of the wire-guiding orifice 19 so that when compressed air will be introduced into the passage 18 the bonding wire 10 will be pushed through the bonding-wire guide 12 under fluid control. A coaxial flow towards the wedge or the bonding capillary tube will arise inside the passage 18 and the conduit guide 20 around the bonding wire 10. This coaxial air flow causes the continued advance of the bonding wire 10 as a function of the intensity of the air blast introduced.

When a gold wire with a diameter in the range between $25\mu$ and $100\mu$ will be used the minimum inside diameter of the restricted outlet end of the wire-guiding orifice 19 will be in the range between $100\mu$ and $130\mu$. The passage 18 as well as the wire-guiding tube, however, present an internal diameter of 1.5 mm to 2.2 mm approximately. The resulting diameter ratios apply in general.

When the pipe 15 is in communication with the vacuum source 14 the bonding wire 10 is actually braked while a substantially constant wire tension will be retained. This provision prevents the drawing of an excessive wire length, particularly during loop formation, which would produce loops out of proportion. When major loops will be formed, however, it is advantageous when an air blast is introduced through the pipe 15. The bonding wire 10 is actually advanced by the blast so that a sufficient length of wire will be available for loop formation. The aforedescribed apparatus is thus particularly well suited for the formation of loops of different sizes in succession. The corresponding control of the fluid control of the bonding wire is achieved through the valve 16 under control of the bonding-head control commands.

In ball bonding, the fluid-controlled maintenance of the wire tension is achieved by a gentle lowering of the "ball" together with the capillary tube to the bonding pad while the alignment of the ball will be retained, which means that the "golf stroke" effect described by way of introduction will be avoided.

The coaxial flow preferably presents a component of spin around the bonding wire, which actually aligns the wire inside the passage 18 and the conduit guide 20. In the illustrated embodiment the conduit guide 20 is downwardly vertically bent towards the wedge or the bonding capillary tube.

The illustrated apparatus as well as the described method are suited for subsequent mounting and application in conventional bonders. The aforedescribed apparatus and the described method have proven their specific advantages in relation to gold-wire bonding techniques.

The fluid control of the bonding wire may preferably be so designed that it will allow for variation, e.g. in terms of pressure and volumetric air flow, with a corresponding change of the wire tension so as to achieve an adaptation to different stages of the bonding head cycle.

Figure 2:
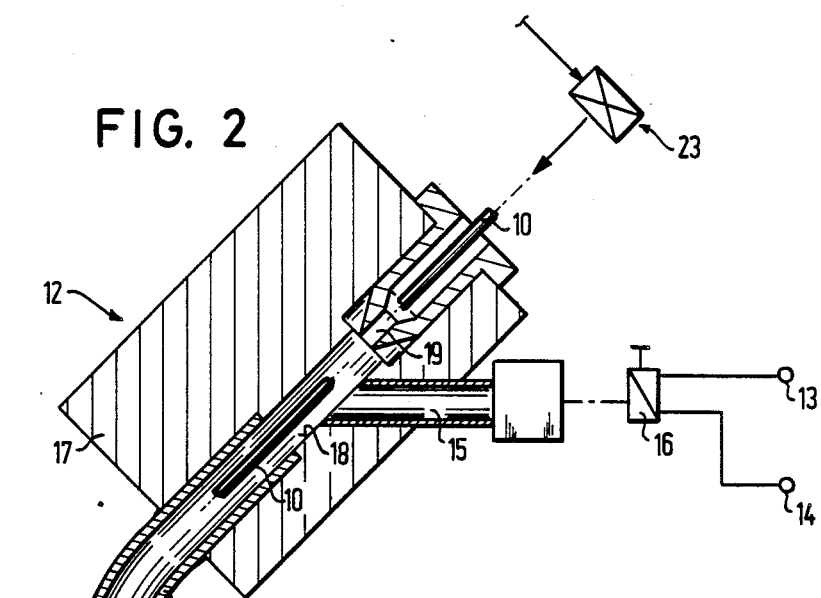
FIG. 2 is a schematic, partly sectional, side view of an apparatus improved over the embodiment of FIG. 1.
Figure 3:
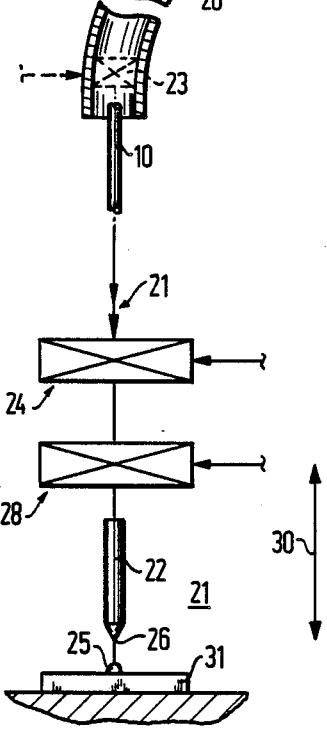
FIG. 3 shows the formation of a loop and the position of the capillary tube immediately before the second "touch-down"
Figure 3:
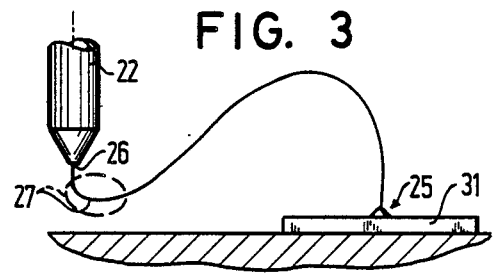
Figure 4:
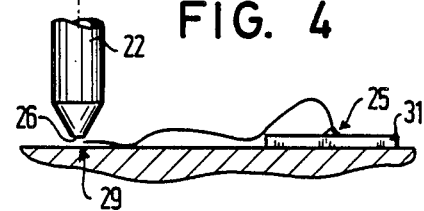
FIG. 4 illustrates an imperfect loop formation with an accordingly imperfect bond as it may occur frequently when conventional bonders are used.

The structure illustrated in FIG. 2 is distinguished from that shown in FIG. 1 by the arrangement of a bonding-wire slip clamp 23 which either precedes the bonding-wire guide duct 12, 18, 19, 20 (as shown in all details in FIG. 1) or is disposed at the end of the bonding-wire conduit guide 20, which faces the capillary tube (as is roughly indicated in FIG.1). In this system, the bonding-wire slip clamp 23 is effective or closed either permanently or only when the bonding head 21 is lowered for the so-called "touch-down" operation. The bonding-wire slip clamp 23 is preferably a clamp whose operative clamp surfaces are coated with a felt material or the like so that the bonding wire 10 may be drawn through it even when the clamp 23 is closed, so that a defined wire tension and rigidity will be maintained while a possibly existing spin in the wire will be removed. This system allows the production of loops which are essentially more rigid than those produced in accordance with prior art, and in addition the production of loops free of any warping caused by the spin. The loops produced with application of the aforedescribed slip clamp (23) do not involve the risk of a loop collapse with formation of imperfect contacts, as is shown in FIG. 4. Rather a loop configuration according to FIG. 5 will be obtained. In the embodiment shown in FIG. 2 moreover a stationary bonding-wire clamp 24 joins downstream of the bonding-wire guide duct 12, 18, 19, 20, to be more precise: downstream of the conduit guide 20; this clamp 24 is stationary stationary insofar as it cannot be moved together with the bonding head 21. Depending on the level of the bonding head 21 or the spacing between the capillary tube tip 26 and the bonding pad 25 it may be closed or opened with retraction and corresponding removal of a bonding wire section 27 (see FIG. 3) which projects downwardly, immediately before "touch-down".

Another bonding-wire clamp 28 is associated with the capillary tube 22 and may be moved up and down together with the bonding head 21.

The bonding wire 10 is supplied to the capillary tube 22 with application of clamps 24, 28 and the slip clamp 23 in the manner described in the following:

At first, the bonding head 21 is lowered from a raised starting or initial position, thereby entraining the bonding wire 10 by means of the clamp 28 arranged at the bonding head 21, while the bonding wire 10 is carried along not only against the effect of a coaxial fluid flow in the bonding-wire guide duct, which maintains the bonding wire 10 under a slight tension, but also against the effect of the slip clamp 23, with previous or simultaneous formation of a "ball" at the free end of the bonding wire 10. During this downward movement of the bonding head 21 or the bonding capillary tube 22 associated therewith, respectively, the bonding wire 10 is thus maintained in a tensioned condition both under fluid control inside the bonding-wire guide duct (connection with the vacuum source 14) and mechanically by the bonding-wire slip clamp 23.

Shortly before touch-down, the bonding-wire clamp 28 moved along with the capillary tube 22 is opened so that the "ball" formed at the free end of the bonding wire 10 will bear against the conical or ball-socket-shaped capillary tube tip 26 while avoiding the aforedescribed golf stroke effect. Then touch-down takes place with simultaneous ultrasonic excitation of the capillary tube 22 and formation of a first bonding pad 25.

Figure 5:
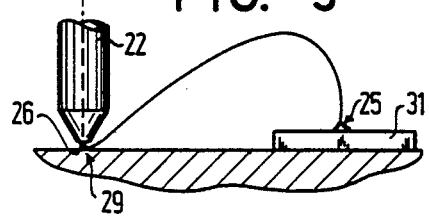
FIG. 5 is a schematic illustration of an optimum loop and an optimum bond acheived with application of the apparatus and/or the method according to the present invention.

When the first bond 25 has been formed on a pad 31 the bonding head 21 is raised again together with the capillary tube 22, up to a defined loop level, preferably with simultaneous opening of the slip clamp 23 if a controllable slip clamp is provided, and, if applicable, with simultaneous deactivation or change-over of the coaxial fluid blast in accordance with the size of the loope to be produced (see foregoing explanations in this respect). Then the second bonding location 29 is positioned opposite the capillary tube 22. The bonding head 21, together with the capillary tube 22, is lowered and entrains the bonding wire 10, again counteracting the effect of the described coaxial fluid flow and, if applicable, with the slip clamp 23 closed again, until the second or repeated touch-down takes place to form a second bonding pad 29 under ultrasonic effect. Preferably, shortly before the second touch-down and in consideration of the loop height, the stationary clamp 24 above the bonding head 21 is closed so as to fix the bonding wire 10 or cause a corresponding retraction of the bonding wire 10 through the downwardly moved capillary tube 22. In this manner, a bonding-wire section 27 that may project downwardly from the capillary tube tip 26 (see FIG. 3) will be removed directly before the second touch-down. This will produce a second bonding pad 29, as is shown in FIG. 5, without the bonding wire resting on or contacting the substrate beyond the actual contact point. Unless the excess bond-wire section 27 will be severed there is the danger of a second bond pad 29 being formed as illustrated in FIG. 4, i.e. a bond pad whose wire rests on the substrate over a length out of proportion. At a defined or programmed level of the bonding head 21 or the capillary tube 22, depending on the bond-wire material and the size of the loop, the clamp 24 is closed. After formation of the second bond pad 29 the clamp 24 is opened again. Moreover, the bonding-head 21 is then raised again up to the so-called tail-length level. With this condition the slip clamp 23 is preferably open if it is of the controllable type. But now as before the aforedescribed coaxial flow is preferably effective so that the bonding wire 10 will be retained. This is applies particularly to cases where the slip clamp 23 is disposed at the capillary-facing end of the bonding-wire conduit guide 20. In the last analysis, the switching of the coaxial blast, i.e. activation and deactivation as well as change-over to a certain flow direction, depends on the intrinsic rigidity, i.e. the material and the diameter of the bonding wire 10.

When the bonding head 21 has reached the tail-length level the clamp 28 associated with the head is closed again. Then the bonding head 21 returns into its initial position while it tears off the bonding wire 10. Then the bonding cycle may be repeated in the aforedescribed manner.

The bonding-wire clamps 24, 28 are conventional wire-clamping devices so that they need not be described and illustrated in more detail. This applies analogously to the configuration of the capillary tube 22.

The slip clamp 23 is designed in correspondence with a conventional wire-clamping structure, however with the distinction that the clamping surfaces are provided with felt or a similar material so that even with the clamp closed the bonding wire 10 may still be drawn through it. The clamping force of the slip clamp 23 may preferably be set; in particular it may be varied so as to be matched with different bonding wires (in terms of both material and diameter).

The system shown in FIG. 2 is also suited for subsequent mounting in or application with conventional bonders.

All of the features disclosed in the application documents are claimed to be essential of the present invention to the extent by which they are novel, either individually or in combination, over prior art.

I claim:

1. Apparatus for the controlled feed of a bonding wire, specifically a golden bonding wire, to the wedge or the capillary tube of a bonding head which may be traversed up and down, comprising a abonding wire guide duct which is disposed ahead of said wedge or said bonding capillary tube, a fluid pipe opening into said capillary tube, a vacuum source capable of being placed in fluid communication with said fluid pipe, an air blast source capable of being placed in fluid communication with said fluid pipe, and means for controlling whether said vacuum source or said air blast source is in fluid communication with said fluid pipe.

2. Apparatus according to claim 1, characterized in that a change-over valve is associated with fluid pipe and is coupled to the bonding head controller, said change-over valve serving to establish communication of said fluid pipe either with said gas blast or air-blast source or with said vacuum source.

3. Apparatus according to claim 1, characterized in that said bonding wire guide duct includes a wire-guiding orifice and a wire conduit guide of a major internal diameter, which adjoins said duct at the wedge or capillary tube side thereof, with said fluid pipe for optional communication with said gas blast or air-blast source or with said vacuum source being located immediately behind said wire-guiding orifice.

4. Apparatus according to claim 3, characterized in that said wire-guiding orifice is fixed at the coil-facing end of a passage formed in a fitting block while said wire conduit guide is connected at the wedge or capillary end of said passage, and that the fluid pipe for optional communication with said gas blast or air-blast source or with said vacuum source opens into the said passage at a location between the said wire-guiding orifice and said wire conduit guide.

5. Apparatus according to claim 1, characterized in that the fluid pipe for optional communication with said gas blast or air-blast source or with said vacuum source opens into the said bonding-wire guide at an acute angle relative to said wire-guiding orifice.

6. Apparatus according to claim 3, characterized in that the internal diameter of the restriction of wire-guiding orifice, which is provided at the outlet end thereof, is in the range between 100 and 130$\mu$ for a wire gauge less than 200$\mu$, whereas the wire conduit guide joining the wire-guiding orifice has an internal diameter of 1.5 to 2.2 mm approximately.

7. Apparatus according to claim 1, characterized by a bonding-wire slip clamp associated with said bonding-wire guide duct and disposed specifically ahead of said bonding-wire guide duct or at its capillary-facing end, which clamp is closed or operative either permanently or only when the said bonding head is lowered for "touch-down".

8. Apparatus according to claim 7, characterized in that the said bonding-wire slip clamp is formed by a clamp whose operative clamping surfaces are coated with felt material or the like.

9. Apparatus, specifically according to claim 1, characterized in that a stationary bonding-wire clamp is disposed downstream of said bonding-wire guide duct, which clamp can be closed when said bonding head has been lowered from defined loop height to a programmable intermediate level, with simultaneous retraction and corresponding removal of a bondingwire section projecting downwardly from the capillary tube tip, immediately before the subsequent "touch-down" motion.

10. Method of controlled feed of a bonding wire, specifically a golden bonding wire, to the wedge or the capillary tube of a bonding head which may be traversed up and down, comprising the steps of:
   pushing with a coaxial gas blast, specifically air, said bonding wire during the bonding process, specifically during loop formation, towards said wedge or capillary tube of said bonding head; and
   alternatively exerting with a coaxial gas blast in an opposite direction a traction force upon said bonding wire in a direction away from said wedge or said capillary tube of said bonding head while maintaining an approximately constant wire tension.

11. Method according to claim 10, characterized in that the direction of said coaxial gas, specifically air, blast may be reversed during the bonding process while the intensity (pressure and/or volumetric efficiency) of said gas, specifically air, blast may be varied.

12. Method according to claim 10, characterized in that the coaxial gas or air blast presents a component of spin about the bonding wire.

13. Method for controlled feed of a bonding wire, specifically a golden bonding wire, to the wedge or the capillary tube of a bonding head which may be traversed up and down comprising the following steps of operation:
   (a) lowering said bonding head from an initial or starting position, while carrying along said bonding wire by means of a clamping means disposed at said bonding head and movable along with said bonding head, while the bonding wire is transported against the effects of a coaxial fluid stream and/or slip clamp which maintains a slight traction of the bonding wire, while a "ball" is formed at the free end of said bonding wire either previously or simultaneously;
   (b) performing a "touch-down" operation with ultrasonic excitation of said capillary tube as well as opening of said bonding head clamp shortly before "touch-down", and formation of a first bond pad;
   (c) raising the bonding head up to a defined loop height, preferably while opening said slip claim, and, whatever required, with closure or change-over of said coaxial fluid flow;

(d) positioning of said second bond pad in opposition to said capillary tube lowering said bonding head while carrying along said bonding wire against the effect of the possibly reactivated coaxial fluid flow as well as of the slip clamp which is possibly closed again, up to the second "touch-down", and formation of a second bond pad under ultrasonic effect;

(e) and raising the bonding head up to a so-called "tail-length" level, with said bonding head clamp being open, preferably even with the said slip clamp being open, however with a preferably continuously effective coaxial flow, whereupon said bonding head clamp is closed again while the upward movement of said bonding head is continued until the latter's initial position will be reached, while said bonding wire is torn off.

14. The apparatus as set forth in claim 1 wherein said means for controlling whether said vacuum source or said air blast source is in fluid communication with said fluid pipe operates to place the fluid pipe in fluid communication with said vacuum source during lowering of the bonding head from a starting position until the end of loop formation and with said air blast source beginning once a second bond pad is formed and during raising of the bonding head until it has returned to its starting position.

* * * * *